United States Patent [19]

Swerlein et al.

[11] Patent Number: 4,870,629

[45] Date of Patent: Sep. 26, 1989

[54] METHOD FOR ELECTRONIC CALIBRATION OF A VOLTAGE-TO-TIME CONVERTER

[75] Inventors: Ronald L. Swerlein, Longmont; David A. Czenkusch, Loveland, both of Colo.

[73] Assignee: Hewlett-Packard Company, Palo Alto, Calif.

[21] Appl. No.: 303,796

[22] Filed: Jan. 30, 1987

[51] Int. Cl.[4] .......................... G04F 8/00; H03K 5/26

[52] U.S. Cl. .................................... 368/120; 368/121; 307/602

[58] Field of Search ................................ 368/113-121; 307/246, 602-603; 364/569

[56] References Cited

U.S. PATENT DOCUMENTS

| | | | |
|---|---|---|---|
| 4,504,155 | 3/1985 | Ruggieri | 368/121 |
| 4,764,694 | 8/1988 | Winroth | 307/602 |
| 4,769,798 | 9/1988 | Hayashi | 368/121 |
| 4,772,843 | 9/1988 | Asaka et al. | 320/1 |

*Primary Examiner*—Vit W. Miska
*Attorney, Agent, or Firm*—Guy J. Kelley

[57] ABSTRACT

A method of calibration for a voltage to time converter in order to increment delays by a fraction of a clock cycle known as an interpolator period is disclosed. The method of calibration compares differences in measurements of a constant and repetitive input waveform while changing current, base voltage threshold, incremental voltage threshold, or any combination thereof to minimize the calibration error for a predetermined number of interpolator periods designed to equal an integral number of clock cycles.

14 Claims, 4 Drawing Sheets

METHOD FOR ELECTRONIC CALIBRATION OF A VOLTAGE-TO-TIME CONVERTER

BACKGROUND OF THE INVENTION

1. Field of the invention

The present invention pertains generally to calibrating dual ramp interpolators used to produce precise delays.

2. Description of the Background

Voltage-to-time converters have been used for measuring the duration between two events. One form of a voltage-to-time converter is the single ramp interpolator. The single ramp interpolator measures durations by accumulating charge on a capacitor from a current source. The resulting voltage is proportional to the duration. For example, one volt may be equal to one microsecond, so 10 volts would be a 10 microsecond delay. The single ramp interpolator has limitations. The amount of delay which can be controlled on a single ramp interpolator is limited by the amount of voltage which can be generated on the capacitor. The single ramp interpolator cannot be used for long delays. Also, the accuracy of the single ramp interpolator is limited by the component tolerances chosen in the design and manufacture of the single ramp interpolator.

A dual ramp interpolator eliminates the problem of the time limitation by providing a clock in conjunction with a voltage-to-time converter. In this way, long periods of duration can be measured. The duration is only limited by the largest number which can be represented by the counter that counts the clock cycles. The clock is used to measure, usually, the majority of the duration with the interpolator interpolating durations which happen in-between clock cycles. For example, an event which occurs one-third of the way through a clock cycle, the clock will only begin to count at the next clock cycle. As much as two-thirds of a clock cycle will be lost in the duration. Sometimes, clocks can begin counting at either the rise pulse or the fall pulse, so the loss would be one-half minus one-third which is equal to one-sixth of a clock cycle.

By putting an interpolator with the clock, this uncertainty is avoided. The interpolator will effectively measure the fraction of a clock cycle.

Often, what is needed is not a precise measurement of the duration between two events, but a predetermined duration between two events. The first event can happen at any time, but the second event is controlled to happen only after a predetermined time from the first event. The single ramp interpolator with a clock can measure reasonably precisely the duration between two events, but cannot control the duration to a predetermined time period. A second ramp interpolator is required. If the predetermined duration is five clock cycles and the first event happens three-fourths of the way through a clock cycle then another four and three-fourths of a clock cycle must be added onto the one-fourth in order to obtain the required five clock cycle delay. The clock can count out the four clock cycles, but a second ramp interpolator must be used to count the three-fourths of a clock cycle.

Instead of using two separate interpolators, a dual ramp interpolator can be used. The dual ramp interpolator interpolates the first fraction of a clock cycle, then holds the resulting voltage at a clock pulse while the clock cycles through an integral number of cycles, and then interpolates another fraction of a clock cycle by ramping to a preselected voltage. When the dual ramp interpolator reaches the preselected voltage then the duration is determined. The preselected voltage should be equivalent to at least one clock cycle, otherwise the interpolator could time-out before reaching the predetermined delay. For example the delay could be chosen to be 5.5 clock cycles, with the clock counting 4.0 cycles and the interpolator counting 1.5 cycles. The 1.5 clock cycles will be split up differently depending on when the first event occurs, but the total ramp time of the dual ramps will always equal 1.5 clock cycles. If the first ramp is 0.9 clock cycles then the second ramp will be 0.6 clock cycles.

Sometimes, the exact interpolator delay is not so important as knowing that the delay will be the same from one series of events to another series of events. For instance, if the delay is 1.7 clock cycles instead of 1.5, but the delay is always 1.7 clock cycles, then this would be satisfactory. It would also be satisfactory if the delay was unknown, but always the same.

The problem is how to vary the delay by a known amount. A common method is to vary the delay by an integral clock cycle or by a clock pulse. The smallest incremental delay change would be one-half of a clock cycle. No other multiples of a fraction less than one would be permissible.

Another way is to vary the preselected voltage at which the second ramp completes the duration. Typically, when this is done, parameters of the components and design are critical. The calibration is achieved by knowing precisely the capacitance(C) of the capacitor, the current of the current source, and the voltage on the capacitor. The time, t is then given by $t=V*C/I$, and the incremental delay, delta t, is given by $delta\ t=delta\ V*C/I$. In a manufacturing environment, where many of these converters are to be built, controlling or measuring each component is expensive and time consuming. Also, component values can change depending on the ambient conditions of temperature, barometric pressure, and humidity. The component values must be controlled, known, or measured for various conditions in order to maintain calibration.

A calibration method is needed which can use components which have wide tolerances and it is not necessary to take the time to know or measure the precise parameter values of the components, yet be able to control the delay accurately.

SUMMARY OF THE INVENTION

The present invention overcomes the limitations of the prior art by providing a method to calibrate a dual ramp interpolator to produce precise interpolator periods using a clock having stable clock cycles of known duration, a voltage measuring means, comprising the steps of: measuring a first reference value of a repetitive and constant frequency waveform after a controlled delay from a constant trigger point, the delay includes at least one clock cycle, the trigger point is synchronized to the input waveform; measuring a first calibration value of a known frequency waveform after a second delay, the second delay equal to the controlled delay minus one clock cycle plus a predetermined number of interpolator periods designed to equal one clock cycle after the calibration is complete; taking a first difference between the first reference value and the first calibration value; changing the slew rate of the interpolator ramp so as to change the interpolator time calibration; measuring a second reference value and a second calibration value; taking a second difference between the second reference value and the second calibration value; selecting the absolute smallest of the two differences; setting the current source to the value which generated the smallest absolute difference.

The delay circuit under calibration is presumed to control the timing of the voltage measuring means. The voltage measuring means can be an analog-to-digital converter or a sample and hold circuit.

An interpolator period is a fraction of a clock cycle. Generally, some multiple of interpolator periods will equal one clock cycle or an integral number of clock cycles.

An advantage of this method is that it can be automated. The calibration, then, can be done anytime and even in-between measurements. This would be difficult to do by calibration methods requiring manually adjusted components.

DETAILED DESCRIPTION

Figure 1:
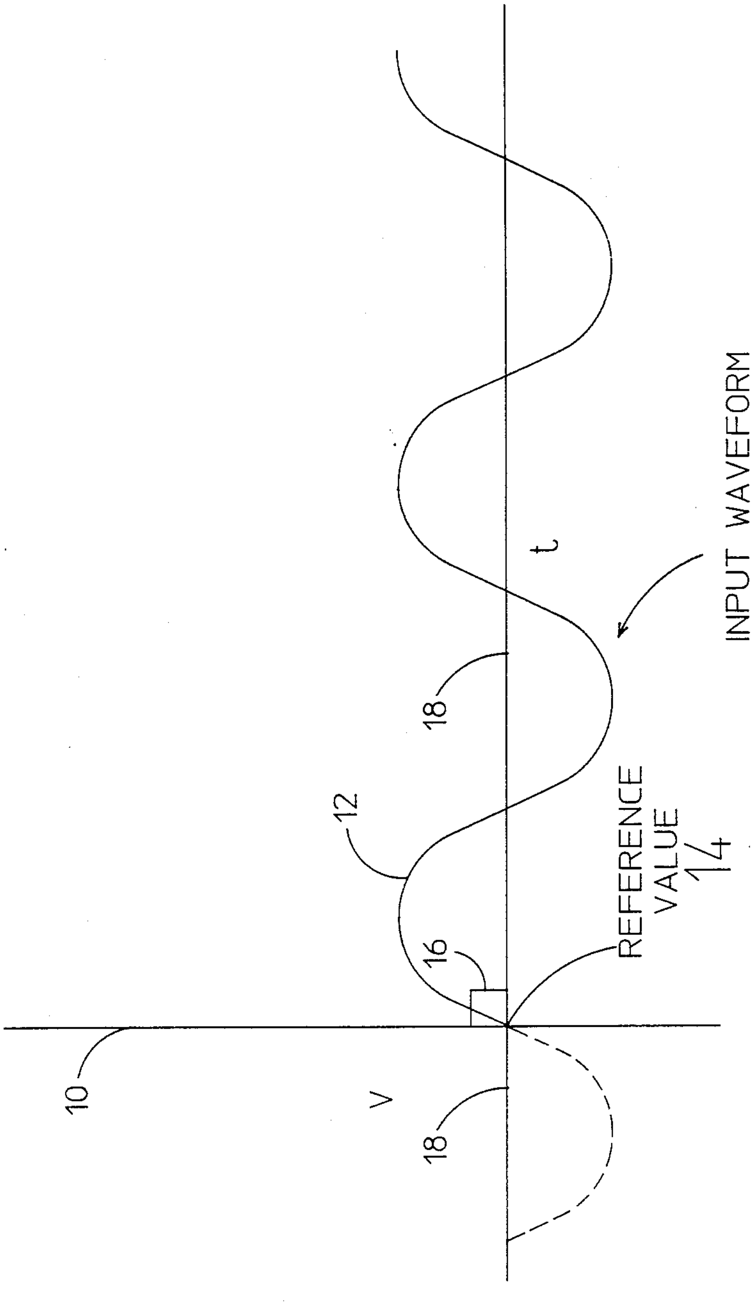
FIG. 1 is a graphical illustration of an input waveform used, for calibration.

FIG. 1 shows an example of an input waveform 12. The waveform can be any periodic waveform within the resolution and bandwidth of the measuring instrument except for oscillating waveforms which have intervals of constant value like a square wave or dc. Measuring instruments can be voltmeters, oscilloscopes, waveform recorders, signal analyzers, and other instruments capable of measuring an electrical signal. However, any continuously changing, ramping periodic waveform can be used; triangle, saw-tooth, sinusoidal. The frequency of the waveform must remain constant throughout the calibration procedure, but it need not be known. No frequencies can be present which are beyond the bandwidth and resolution of the sampling voltmeter. If frequencies higher than the resolution of the sampling voltmeter are present then reference values and calibration values which are actually very close to each other in time may appear to be very far apart because of a large difference in their respective voltage measurements. The voltage axis 10 indicates voltage as a function of the time axis 18. The reference value 14 in this case is chosen to be the zero value raising slope of the input waveform. This reference value can be chosen as any point on the input waveform as long as it is always the same position of the waveform during the entire calibration procedure. The reference value 14 must be chosen such that all measurements 20 remain monotonic, but not constant, for all values of delay produced by the circuit under calibration during the calibration procedure. The reference value 14 is chosen and the voltage axis 10 and time axis 18 can be placed so the reference value is at the origin. The values of interest, then, for one embodiment of the invention are contained in box 16. This area of the input waveform is expanded in the other figures to better show the calibration procedure.

Figure 2:
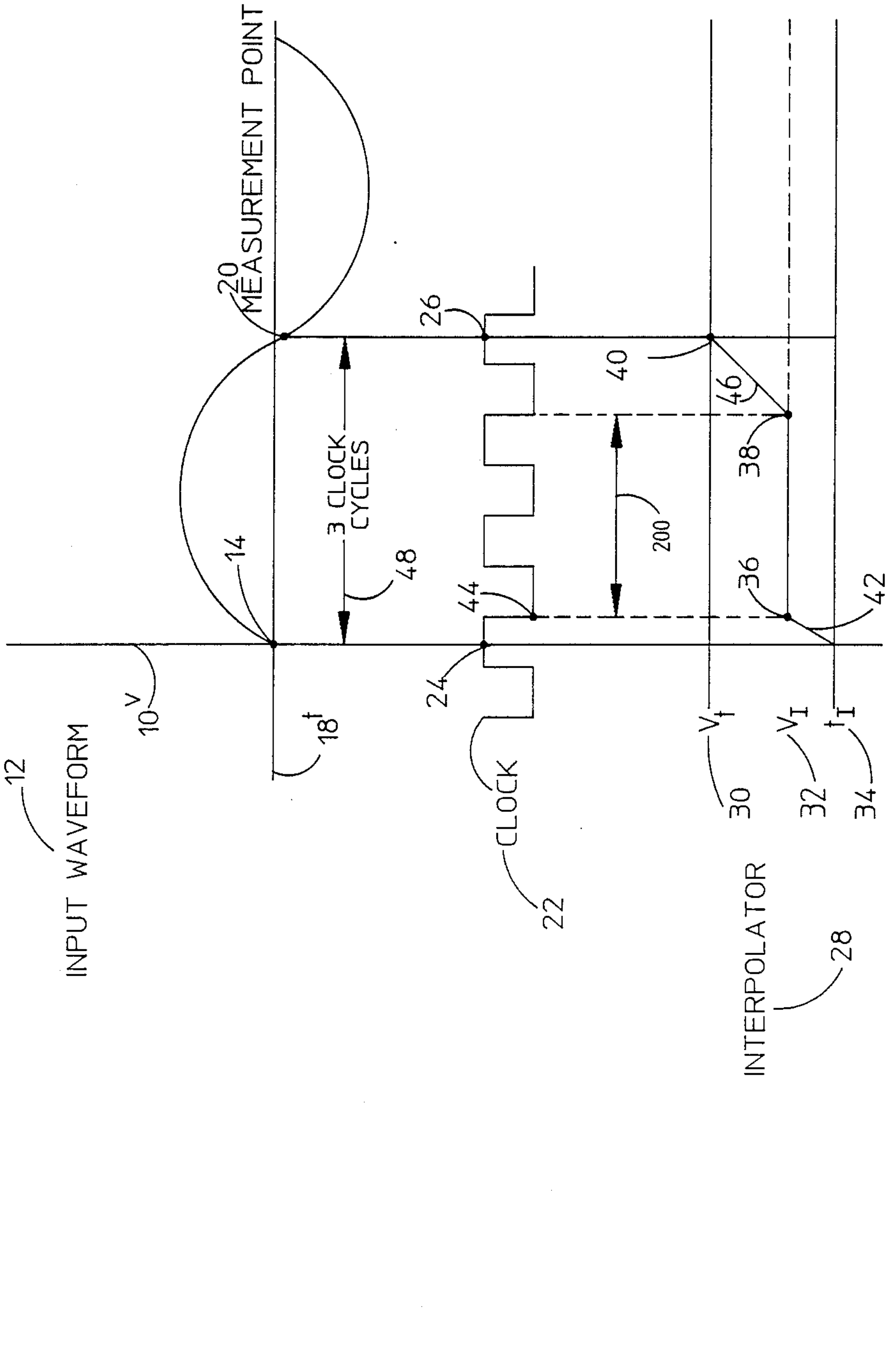
FIG. 2 correlates the reference point, for the input trigger signal, of the input waveform to the clock cycles to a clock cycle. This shows how interpolation works with a dual ramp interpolator.

FIG. 2 shows how an interpolator 28 maintains a constant duration from a known reference point 14 (trigger) on the input waveform 12 to a measurement point 20 (trigger out). The reference point 14 can occur at anytime during a clock 22 cycle. For illustration, the reference point 14 occurs at clock time 24. Unless this time were to be taken into account, there would be an uncertainty in when the point 14 occurred of at least one-half of a clock cycle. The interpolator is one way to avoid this uncertainty. In this case, the interpolator records of how long the trigger has occurred before the falling edge of the clock 22. It could also be the case that a rising edge be used. Another way is to use the next edge, whether rising or falling or the second rising edge, the second falling edge, or the second edge whether rising or falling. The interpolator voltage ramp 42 can continue until some predetermined clock signal occurs. The next falling edge 44 is only a particular case.

At reference point 14 a trigger occurs which starts the interpolator ramp 42. This voltage ramp continues until a predetermined clock signal 44 occurs. At this point 36, the voltage level is held for a predetermined number of clock cycles 200 which can be counted using usual techniques. In this case, two clock cycles 200 are counted. At the end of two clock cycles 38, the interpolator resumes the voltage ramp 46 until a voltage of Vt (30) is reached. The threshold voltage Vt (30) has been set to give a delay of a predetermined number of clock cycles from the reference point 14 to the measurement point 20. The predetermined number of clock cycles need not be an integer or whole number of clock cycles. In this case, Vt is chosen to give a delay of three clock cycles 48. The slopes of the voltage ramps 42 and 46 are equal and remain constant once the interpolator is calibrated. As long as the slopes remain constant from one interpolation to the next and the number of predetermined clock cycles to be counted between points 36 and 38, the delay between the reference point 14 and the measurement point 20 will be the same. The total delay can be controlled by changing the clock cycle counting 200. As long as the voltage ramp slopes 42 and 46 remain constant then the delay between the reference point 14 and point 36 plus the delay between point 38 and point 40 will remain constant, and in this case, always equal one clock cycle.

Another way to change the total delay is to change Vt. In order to be able to change the total delay 48 to a new known delay, the voltage change must be calibrated to time. By changing Vt instead of changing the clock counting 200, delay can be changed by fractions of a clock cycle instead of being limited to increments of one-half clock cycles. Fractions much less than one can be achieved. In this way, the delay can be controlled to fractions of a clock cycle. However, a method of calibration must be used to calibrate changes in Vt to changes in delay.

Figure 3:
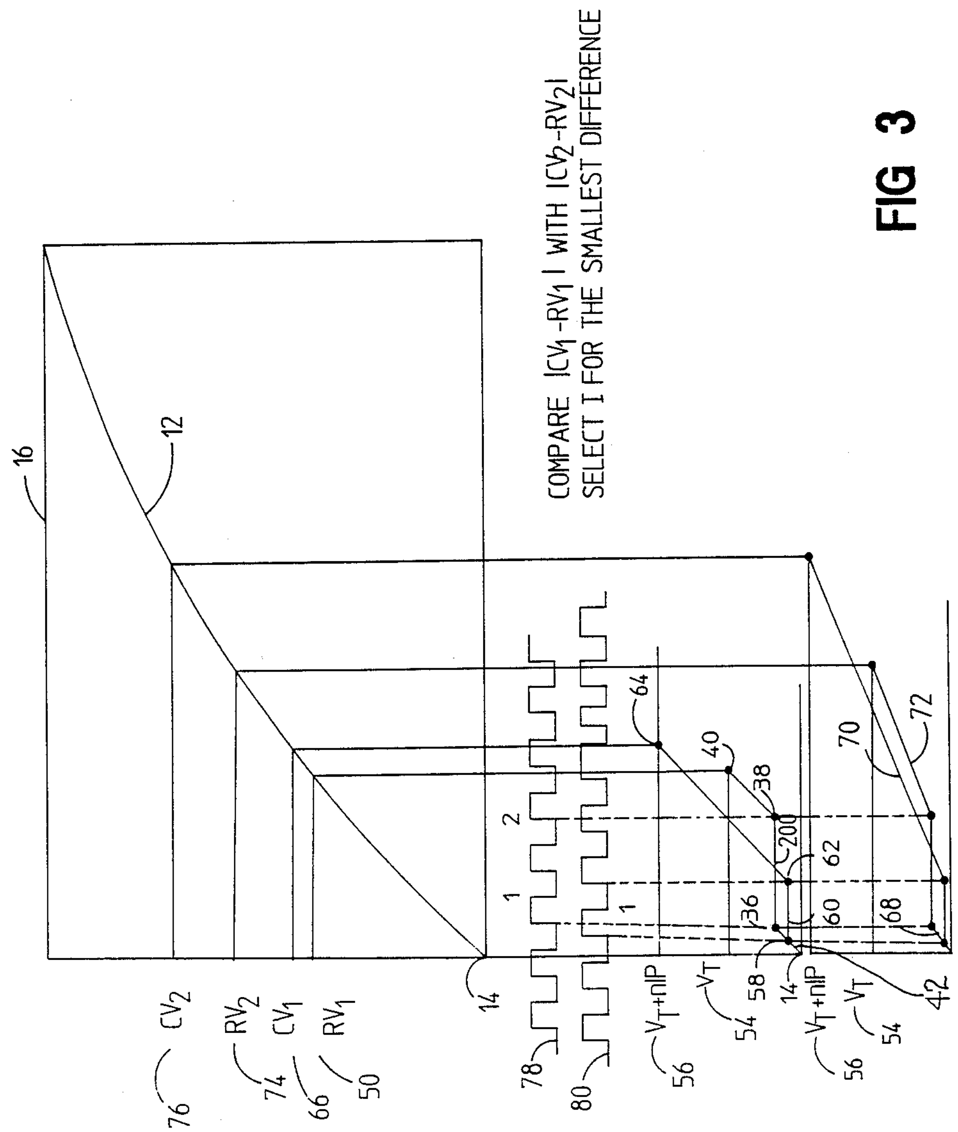
FIG. 3 combines two sets of two measurements and correlates them to the clock and input waveform to demonstrate the calibration procedure using the method of changing the current slew rate.

FIG. 3 illustrates how the invention calibrates Vt to delay times. A voltage ramp 42 is set to occur at reference point 14 until a predetermined clock signal as in the process described in FIG. 2. At point 40, a measurement 50 is taken and recorded. The clock cycle counting period 200 is changed by a predetermined amount. In this case, period 200 is reduced by one clock cycle. The threshold voltage 54 is changed to a new threshold voltage 56 equal to the original threshold voltage plus the number of fractions of a clock cycle it takes to equal one clock cycle times the incremental voltage. The fraction of a clock cycle is called an interpolator period. An interpolator period could be one-tenth of a clock cycle, one-sixteenth of a clock cycle, one-hundredth of a clock cycle, or any other fraction of a clock cycle. On another period of the input waveform 12, the interpolator starts the voltage ramp at point 14 until a predetermined clock signal 58. The voltage is held 60 for one clock cycle until 62, when the interpolator voltage ramp resumes. At the new threshold voltage 56 (Vt+n*IP), a second measurement 66 is taken and recorded. If the interpolator were perfectly calibrated, measurement 50 and measurement 66 would be equal; the difference between measurement 50 and measurement 66 would be zero. In this example, the two measurements are not equal. Another voltage ramp slope 68 (70, 72) is selected. In the same manner as above, two more measurements are taken, 74 and 76, and recorded. Also, as above, the difference between measurement 74 and measurement 76 indicates how well the interpolator is calibrated. FIG. 3 only shows two clock waveforms 78 and 80. Measurement 50 is based on clock waveform 78. Measurement 66 is based on clock waveform 80. The phase relationship between the trigger on reference point 14 and the clock waveform is arbitrary. Also, in this example, measurements 74 and 76 are based on the clock waveforms 78 and 80 respectively. It is unlikely that the clock waveforms used for measuring measurements 74 and 76 would be identical to those for measurements 50 and 66. All the measurements are based on two clock waveforms merely for ease of comparison. In reality, there would be four distinct clock waveforms, one for each measurement. Each would be independent of each other because that is exactly the purpose of the interpolator, to synchronize the clock waveform to the input waveform regardless of the phase of the clock.

A comparison is made between the difference of measurement 50 and measurement 66 and the difference of measurement 74 and measurement 76. The voltage ramp slope which gives rise to the smallest difference is selected for operation of the calibrated interpolator.

Another way is to continue to make series of two measurements, a reference value and a calibration value. Continue to compare the differences. Select the current value which gives rise to the voltage ramp with the smallest difference.

The above described process can be iterated many times, as few as two or as many as several thousand or more. It depends on how many variations of the voltage ramp can be made and how far away from calibration the interpolator could be based on the designed tolerances of the interpolator components.

Figure 4:
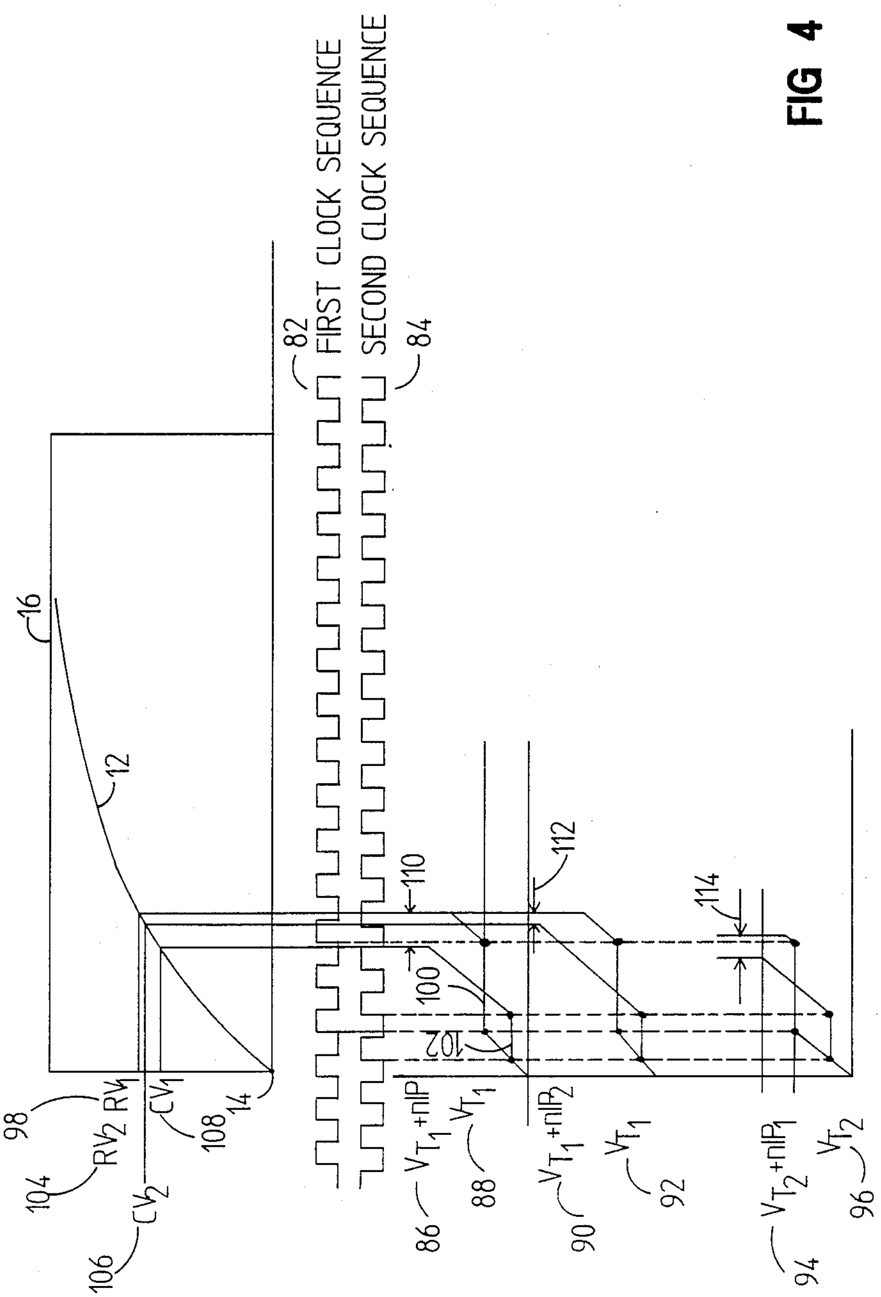
FIG. 4 illustrates the method of calibration using a constant current slew rate and changing either the voltage threshold or the voltage increment corresponding to the number of interpolator periods equal to one clock cycle.

FIG. 4 illustrates using the method of calibration by calibrating changes in the threshold voltage Vt instead of changing the voltage ramp rate. The threshold voltage is set at Vt1 (88). A reference value RV1 (98) is taken on the input waveform a predetermined delay after the trigger point 14 as in FIG. 3. A calibration measurement CV1 (108) is taken. In this case, one clock cycle during the hold period 100 is subtracted to produce hold period 102. The voltage threshold is changed to Vt1 plus a first incremental voltage called nIP1 (86). The increase in threshold voltage is supposed to make up for the decrease in the hold period.

Another set of two measurements are taken. Either the incremental voltage can be changed (90) or the base threshold voltage can be changed (96) or a combination of the two can be changed. Two more measurements are taken, a reference value RV2 (104) and a calibration value CV2 (106).

A first difference between RV1 and CV1 corresponding to gap 110 is obtained and a second difference between RV2 and CV2 corresponding to 112 or 114 is obtained. The two differences are compared. The voltage threshold and incremental voltage combination with the smallest difference is selected as the calibrated operating value for the interpolator.

The base threshold and incremental voltage can be changed many times and the respective differences compared in order to minimize the difference or error of calibration.

Two clock sequences 82 and 84 are shown in this example. Typically, there would be six independent clock sequences for the six measurements shown. Two clock sequences are used for illustrative purposes only and for ease of comparison. However, each measurement has its own unique clock cycle. If any would be identical, it would be completely fortuitous.

Also, RV1 (98)may be a statistical average of many measurements, as may any of the other measurements 104, 106, 108.

Generally, throughout this specification, a clock cycle can mean a full period of the clock or one-half the period of the clock.

The foregoing description of the invention has bee presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method to calibrate a dual ramp interpolator to produce precise interpolator periods using a clock having stable clock cycles of known duration, a voltage measuring means, a variable current source producing a slew rate of an interpolator ramp, a variable voltage reference, the method comprising the steps of:

setting the variable current source to a first baseline current;

setting the variable voltage reference to a first voltage reference;

measuring a first reference value of a repetitive and constant frequency waveform after a first controlled delay, determined by the first voltage reference, from a constant trigger point, the first delay includes at least one clock cycle, the trigger point is synchronized to the input waveform;

setting the variable voltage reference to the first voltage reference plus a first voltage increment chosen to produce a predetermined number of interpolator periods designed to equal the predetermined integral number of clock cycles after the calibration is complete;

measuring a first calibration value of a known frequency waveform after a second controlled delay, the second delay equal to the controlled delay minus a predetermined integral number of clock cycles plus a predetermined number of interpolator periods designed to equal the predetermined integral number of clock cycles after the calibration is complete;

taking a first difference between the first reference value and the first calibration value;

changing the variable current source to a second current value;

changing the variable voltage reference to the first voltage reference;

measuring a second reference value of a repetitive and constant frequency waveform after a third controlled delay, determined by the first voltage reference and the second current value, from a constant trigger point, the first delay includes at least one clock cycle, the trigger point is synchronized to the input waveform;

setting the variable voltage reference to the first voltage reference plus the first voltage increment chosen to produce a predetermined number of interpolator periods designed to equal the predetermined integral number of clock cycles after the calibration is complete;

measuring a second calibration value of a known frequency waveform after a fourth controlled delay, the fourth delay equal to the third controlled delay minus a predetermined integral number of clock cycles plus a predetermined number of interpolator periods designed to equal the predetermined integral number of clock cycles after the calibration is complete;

taking a second difference between the second reference value and the second calibration value;

selecting the absolute smallest of the two differences;

setting the current source to the value which generated the smallest absolute difference of the first difference and the second difference.

2. A method of calibrating a dual ramp interpolator having a variable current source to provide for a voltage ramp and a variable voltage reference, using a clock having cycles, comprising the steps of:

providing a periodic input waveform;

providing a sampling voltmeter;

setting a baseline voltage reference on the dual ramp interpolator;

providing a first predetermined current source value to the dual ramp interpolator;

triggering on a known reference point of the input waveform;

waiting a controlled delay from the known reference point using the baseline voltage reference to control the delay and interpolate between clock cycles, the delay comprises the interpolation delay plus at least one clock cycle;

measuring with the sampling voltmeter the input waveform a first reference measurement;

setting the variable voltage reference to the baseline voltage reference plus a first incremental voltage chosen to produce a predetermined number of interpolator periods designed to equal the predetermined integral number of clock cycles after the calibration is complete;

triggering on the known reference point of a second period of the input waveform;

waiting the controlled delay from the known reference point, the delay comprising the interpolation delay plus at least one set of preselected interpolation periods designed to equal to one clock cycle;

measuring with the voltmeter the input waveform a first calibration measurement;

taking a first difference between the first reference measurement and the first calibration measurement;

providing a second predetermined current source to the dual ramp interpolator;

triggering on the known reference point of the input waveform;

waiting a controlled delay from the known reference point using the baseline voltage reference to control the delay and interpolate between clock cycles, the delay comprising the interpolation delay plus at least one clock cycle;

measuring with the voltmeter the input waveform a second reference measurement;

setting the variable voltage reference to the baseline voltage reference plus the first incremental voltage chosen to produce a predetermined number of interpolator periods designed to equal the predetermined integral number of clock cycles after the calibration is complete;

triggering on the known reference point of a second period of the input waveform;

waiting a second controlled delay from the known reference point, the delay comprising the interpolation delay plus at least one set of interpolation periods equal to one clock cycle;

measuring with the voltmeter the input waveform a second calibration measurement;

taking a second difference between the second reference measurement and the second calibration measurement;

comparing the first difference to the second difference;

selecting a minimum absolute difference from the comparison of the first difference to the second difference;

setting the current to the dual ramp interpolator at the current which had the minimum absolute difference.

3. The method of claim 2 wherein the dual ramp interpolator comprises a dual capacitor recycling dual ramp interpolator.

4. The method of claim 2 wherein the first reference measurement comprises an average of a plurality of voltmeter measurements, each measurement taken after a constant delay from a trigger, the plurality of measurements are statistically operated upon to produce the average.

5. The method of claim 4 wherein the first calibration measurement comprises an average of a plurality of voltmeter measurements, each measurement taken after a constant delay from a trigger, the plurality of measurements are statistically operated upon to produce the average.

6. The method of claim 5 wherein the second calibration measurement comprises an average of a plurality of voltmeter measurements, each measurement taken after a constant delay from a trigger, the plurality of measurements are statistically operated upon to produce the average and wherein the second reference measurement comprises an average of a plurality of voltmeter measurements, each measurement taken after a constant delay from a trigger, the plurality of measurements are statistically operated upon to produce the average.

7. The method of claim 6 further comprising the steps of:

providing a plurality of predetermined current sources;

obtaining a plurality of differences;

comparing the differences;

selecting a minimum absolute difference;

setting the variable current source to the predetermined current level which had the minimum absolute difference.

8. A method of calibrating a voltage-to-time converter having a variable value current source, to produce precise interpolator delays for a sampling circuit in a voltmeter with input for a waveform to be measured, the method comprising the steps of;

setting a first value of the current source;

measuring a first difference between known frequency waveform measurements taken after a controlled delay and after the controlled delay minus at least one clock cycle plus the number of interpolator periods to equal one clock cycle;

setting a second value of the current source;

measuring a second difference between known frequency waveform measurements taken after a controlled delay and after the controlled delay minus at least one clock cycle plus the number of interpolator periods to equal one clock cycle;

choosing the value of the current source which equals a minimum absolute difference to be the calibrated current for the voltage-to-time converter.

9. A method to calibrate a dual ramp interpolator to produce precise interpolator periods using a clock having stable clock cycles of known duration, a voltage measuring means, a variable voltage reference, the method comprising the steps of:

setting the variable voltage reference to a first baseline voltage reference;

measuring a first reference value of a repetitive and constant frequency waveform after a first controlled delay, determined by the first baseline voltage reference level, from a constant trigger point, the first delay includes at least one clock cycle, the trigger point is synchronized to the input waveform;

changing the variable voltage reference to a first voltage reference equal to the first baseline voltage reference plus a first incremental voltage, the first incremental voltage chosen to produce a predetermined number of interpolator periods designed to equal the predetermined integral number of clock cycles after the calibration is complete;

measuring a first calibration value of a constant and repetitive frequency waveform after a second controlled delay, the second delay determined by the first voltage reference so the second delay equals the first controlled delay minus a predetermined integral number of clock cycles plus a predetermined number of interpolator periods designed to equal the predetermined integral number of clock cycles after the calibration is complete;

taking a first difference between the first reference value and the first calibration value;

changing the variable voltage reference to a second baseline voltage reference;

measuring a second reference value of a repetitive and constant frequency waveform after a third controlled delay, determined by the second baseline voltage reference level, from a constant trigger point, the third delay includes at least one clock cycle, the trigger point is synchronized to the input waveform;

changing the variable voltage reference to a second voltage reference equal to the second baseline voltage plus a second incremental voltage chosen to produce a predetermined number of interpolator periods designed to equal the predetermined integral number of clock cycles after the calibration is complete;

measuring a second calibration value of a constant and repetitive frequency waveform after a fourth controlled delay, the fourth delay determined by the second voltage reference so the fourth delay equals the third controlled delay minus a predetermined integral number of clock cycles plus a predetermined number of interpolator periods designed to equal the predetermined integral number of clock cycles after the calibration is complete;

taking a second difference between the second reference value and the second calibration value;

selecting the absolute smallest of the first difference and the second difference;

setting the voltage reference to the value which generated the smallest absolute difference.

10. The method of claim 9 wherein the dual ramp interpolator comprises a dual capacitor recycling dual ramp interpolator.

11. The method of claim 9 wherein the first reference measurement comprises an average of a plurality of voltmeter measurements, each measurement taken after a constant delay from a trigger, the plurality of measurements are statistically operated upon to produce the average.

12. The method of claim 11 wherein the first calibration measurement comprises an average of a plurality of voltmeter measurements, each measurement taken after a constant delay from a trigger, the plurality of measurements are statistically operated upon to produce the average.

13. The method of claim 12 wherein the second calibration measurement comprises an average of a plurality of voltmeter measurements, each measurement taken after a constant delay from a trigger, the plurality of measurements are statistically operated upon to produce the average and wherein the second reference measurement comprises an average of a plurality of voltmeter measurements, each measurement taken after a constant delay from a trigger, the plurality of measurements ar statistically operated upon to produce the average.

14. The method of claim 13 further comprising the steps of:

providing a plurality of predetermined voltage references;

obtaining a plurality of differences;

comparing the differences;

selecting a minimum absolute difference;

setting the variable voltage reference to the predetermined voltage reference level which had the minimum absolute difference.

* * * * *